United States Patent

Lyghounis

[11] 3,943,466
[45] Mar. 9, 1976

[54] COMPANDER FOR TDM TELECOMMUNICATION SYSTEM

[75] Inventor: Evangelo Lyghounis, Milan, Italy

[73] Assignee: Societa Italiana Telecomunicazioni Siemens S.p.A., Milan, Italy

[22] Filed: July 1, 1974

[21] Appl. No.: 484,961

[30] Foreign Application Priority Data
July 12, 1973  Italy .................................. 26504/73

[52] U.S. Cl. .................. 333/14; 179/15 AV; 333/1; 340/347 AD
[51] Int. Cl.² H03G 7/00; H04B 1/64; H03K 13/02; G08C 15/06
[58] Field of Search ....... 333/14, 1; 325/38 R, 38 B; 179/15 R, 15 A, 15 AC, 15 AQ, 15 AV; 340/347 AD

[56] References Cited
UNITED STATES PATENTS

| | | | |
|---|---|---|---|
| 3,298,017 | 1/1967 | Avignon et al. ..................... | 340/347 |
| 3,414,818 | 12/1968 | Reidel .............................. | 325/38 B |
| 3,632,996 | 1/1972 | Paine ............................ | 340/347 DA |
| 3,688,221 | 8/1972 | Fruhalf .......................... | 325/38 B X |
| 3,705,359 | 12/1972 | Kappes .............................. | 325/38 R |

Primary Examiner—Archie R. Borchelt
Assistant Examiner—Marvin Nussbaum
Attorney, Agent, or Firm—Karl F. Ross; Herbert Dubno

[57] ABSTRACT

Amplitude samples of voice signals to be transmitted by pulse-code modulation are compared with a quasi-exponential reference voltage generated during each sampling interval while a binary counter receives a train of isochronous clock pulses, the reading of the counter at the instant of a match being stored in a memory for subsequent insertion into a message frame. Positive and negative signals are distinguished by a sign bit preceding the amplitude code; in one embodiment the reference voltage is sequentially generated with opposite polarities in successive halves of a sampling interval, the counter having an additional stage to generate the sign bit. Decoding at the receiving end is achieved with the aid of another binary counter whose output is compared with the amplitude code and, in the event of a match, causes the instantaneous value of a similar reference voltage to be sampled and stored for subsequent integration.

8 Claims, 7 Drawing Figures

FIG. 5
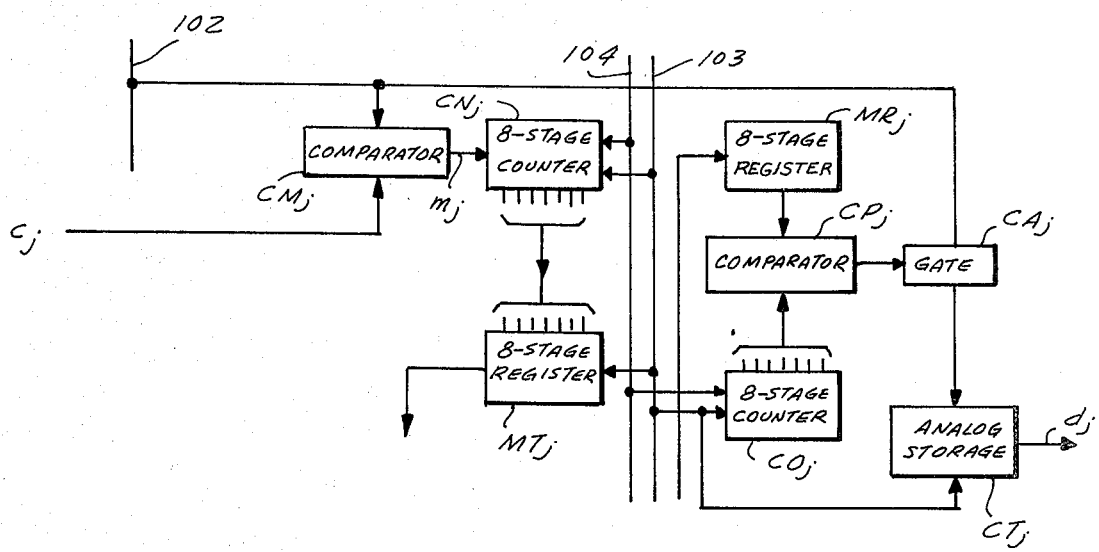
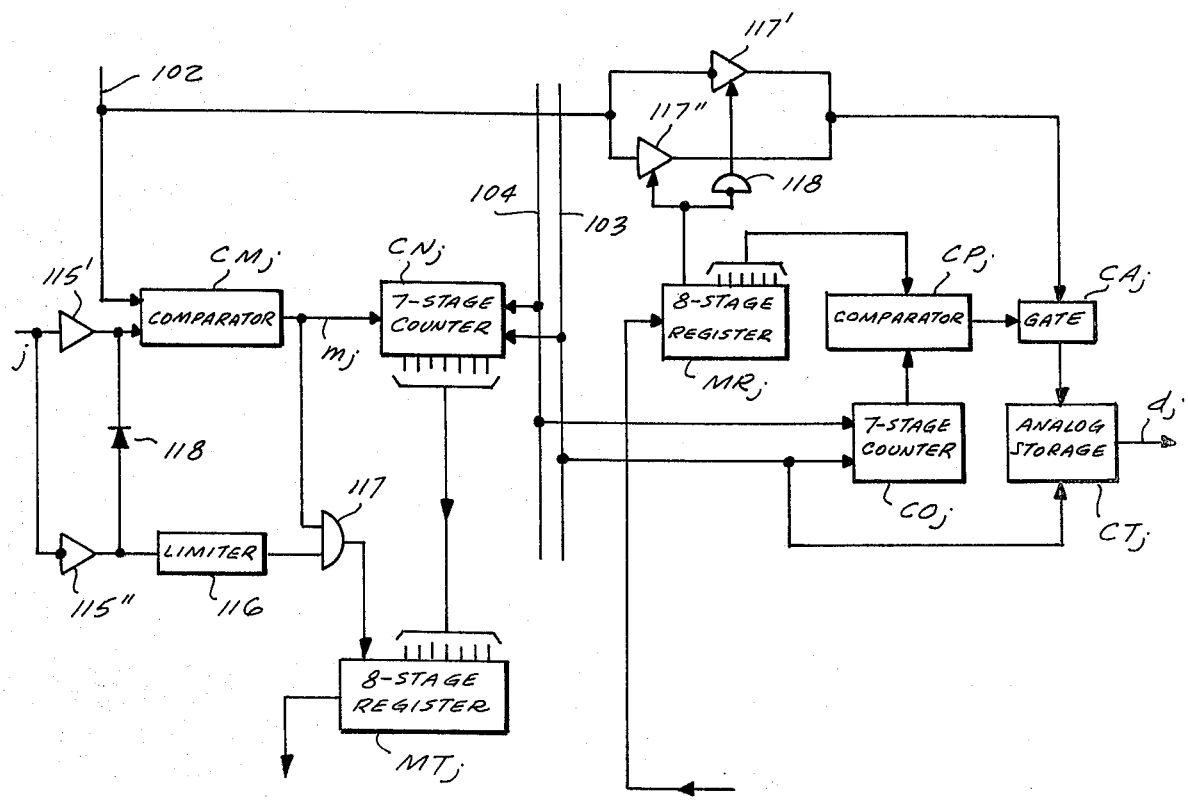
FIG. 6

COMPANDER FOR TDM TELECOMMUNICATION SYSTEM

FIELD OF THE INVENTION

My present invention relates to a telephone or other telecommunication system of the time-division-multiplex (TDM) type wherein a transmitting terminal, serving a multiplicity of incoming signal channels, is connected via a transmission line or other communication link with a receiving terminal serving a multiplicity of outgoing channels, with periodic sampling of the incoming channels at the transmitting terminal and coding of the amplitude samples in binary form, the resulting code words being interleaved during a sampling period for transmission within a message frame to the receiving terminal where they are decoded and distributed to the outgoing channels for which they are intended.

BACKGROUND OF THE INVENTION

The coding and decoding of the interleaved amplitude samples may be performed by a single coder and a single decoder common to all the channels served by the respective terminal, but this may give rise to objectionable crosstalk; moreover, such a common coder or decoder must operate at a very high speed commensurate with the number of bits in all the interleaved code words. Thus, the use of individual coders and decoders for the several channels is often preferred.

Conventional coders work with a ramp-function generator producing a linearly varying reference voltage whose instantaneous magnitude is compared with the signal amplitude to be encoded; the time required for the reference voltage to reach the signal amplitude is a measure of the value of the latter and can be translated into binary form by determining the number of counting pulses in a sequence of such pulses starting at the beginning of each coding interval. In order to limit the range of signal amplitudes to be encoded, it is desirable to operate on a generally exponential compression characteristic during coding and on a complementary expansion characteristic during decoding. This companding effect can be achieved by progressively decreasing the cadence of the counting pulses during a coding interval (and correspondingly increasing that cadence on decoding) so that the counting rate varies with the slope of the desired characteristic.

In such a companding system, however, pulses must be generated and counted during part of a cycle at a rate which is a multiple of the mean counting rate, i.e. the pulse-repetition frequency that would be required for linear coding. In the case of a bipolar characteristic whose positive and negative branches are each divided into eight straight segments approximating an exponential curve (see for example U.S. Pat. No. 3,688,221), the slope of the first two segments is 32 times as high as that of the final segment so that the initial counting speed must be 16 times the mean. With a sampling rate of, say, 8 kHz and $2^7=128$ quantizing levels for the signal amplitude, semiconductors adapted to handle such high pulse cadences are quite costly.

OBJECTS OF THE INVENTION

The principal object of my present invention, therefore, is to provide a compander of the general type referred to in which these high pulse cadences are avoided and which therefore can make use of less expensive circuit components.

Another object is to provide in a TDM telecommunication system of this nature, with parallel coding and decoding of the several channels, centralized sources of timing pulses and reference voltages common to all coders and decoders.

SUMMARY OF THE INVENTION

In accordance with my present invention, the transmitting and receiving terminals of a communication link are provided with synchronous timing means for generating respective sequences of $2^n$ isochronous clock pulses during a coding interval occurring either once or twice per sampling period, the number $2^n$ representing a multiplicity of quantizing amplitude levels subdivided into $2^m$ groups of $2^p$ levels per group so that $n = m + p$; in the specific case hereinafter considered in detail, $m = 3$ and $p = 4$. A first signal generator at the transmitting terminal and a second generator at the receiving terminal, controlled by the timing means, produces during each coding interval a reference voltage following a quasi-exponential curve divided into $2^m$ straight segments each coinciding with a series of $2^p$ clock pulses. A plurality of coders at the transmitting terminal, one for each incoming channel, include each a first comparator connected to the first signal generator for receiving its reference voltage and further connected to the respective incoming channel for receiving the amplitude samples to be coded, a first binary clock-pulse counter in each coder being connected on the one hand to the timing means for zero-setting at the beginning of each coding interval and on the other hand to the first comparator for halting its count whenever the instantaneous magnitude of the reference voltage equals the amplitude samples to be coded. The binary codes thus read out from the counters of the several coders are delivered, preferably after storage in respective binary registers, to a multiplexer which assembles them in an outgoing message frame as is well known per se. At the remote receiving terminal a demultiplexer distributes the arriving binary codes to the several decoders each including a second binary clock-pulse counter connected to the timing means for zero-setting at the beginning of a decoding interval of the same duration as the coding interval at the transmitting end. This latter counter works into a second comparator which is also connected to the demultiplexer, preferably by way of another binary register, to determine the instant when an arriving binary code matches its own count, the second comparator thereupon opening a normally closed sampling gate connected to the second signal generator for delivering to an output circuit a reconstituted amplitude sample determined by the instantaneous magnitude of the reference voltage from this signal generator. The output circuit advantageously includes storage means for this amplitude sample so as to provide a substantially continuous replica of the original signal wave.

If the signals to be transmitted are of the bipolar kind, as is usually the case in a telephone system, each binary code transmitted over the communication link should be supplemented by a sign bit as known per se. For this purpose I provide polarity-discriminating means in each coder, generating such a sign bit, and polarity-restoring means in each decoder responsive to the sign bit in the arriving code word.

According to a more specific feature of my invention, each sampling period encompasses two coding intervals in which the reference wave appears alternately with positive and negative polarity as determined by timer-controlled inverters. The polarity-discriminating means at each coder then simply comprises an additional, $(n+1)^{th}$ stage in the first counter while the polarity-restoring means at each decoder comprises another such additional stage in the second counter. As more fully described hereinafter, such a counter with $n+1$ stages (i.e. eight stages in the specific example given) automatically produces the proper sign bit to indicate the opposite polarity when a comparison with a reference voltage of one polarity is inconclusive, i.e. when the counter is not stopped in the first coding interval of a sampling period.

According to a further feature of my invention, a signal generator adapted to produce a quasi-exponential reference voltage comprises a source of direct current connected across a resistive/capacitive network which includes a set of switches for altering its resistivity, these switches being controlled via a logic matrix by an ancillary counter with at least $m$ binary stages connected to a frequency divider for stepping by successive switching pulses which occur at a rate of $2^p$ pulses per coding (or decoding) interval. More particularly, the switching network comprises $2^m - 1$ resistors connected in parallel across the d-c source by way of a common capacitor, the first two resistors being of identical resistance R whereas the remaining resistors have respective resistances R/2, R/4 and so forth, progressively diminishing by a factor of 2. The switches within the network open-circuit all but the first resistor (of magnitude R) until the occurrence of the third switching pulse of a coding or decoding interval whereupon the remaining resistors are successively connected in circuit with the capacitor.

BRIEF DESCRIPTION OF THE DRAWING

The above and other features of my invention will now be described in detail with reference to the accompanying drawing in which:

FIG. 5 shows in greater detail some of the elements of the system of FIG. 1; and FIG. 6 is a view similar to FIG. 5, illustrating a modification.

SPECIFIC DESCRIPTION

Figure 1:
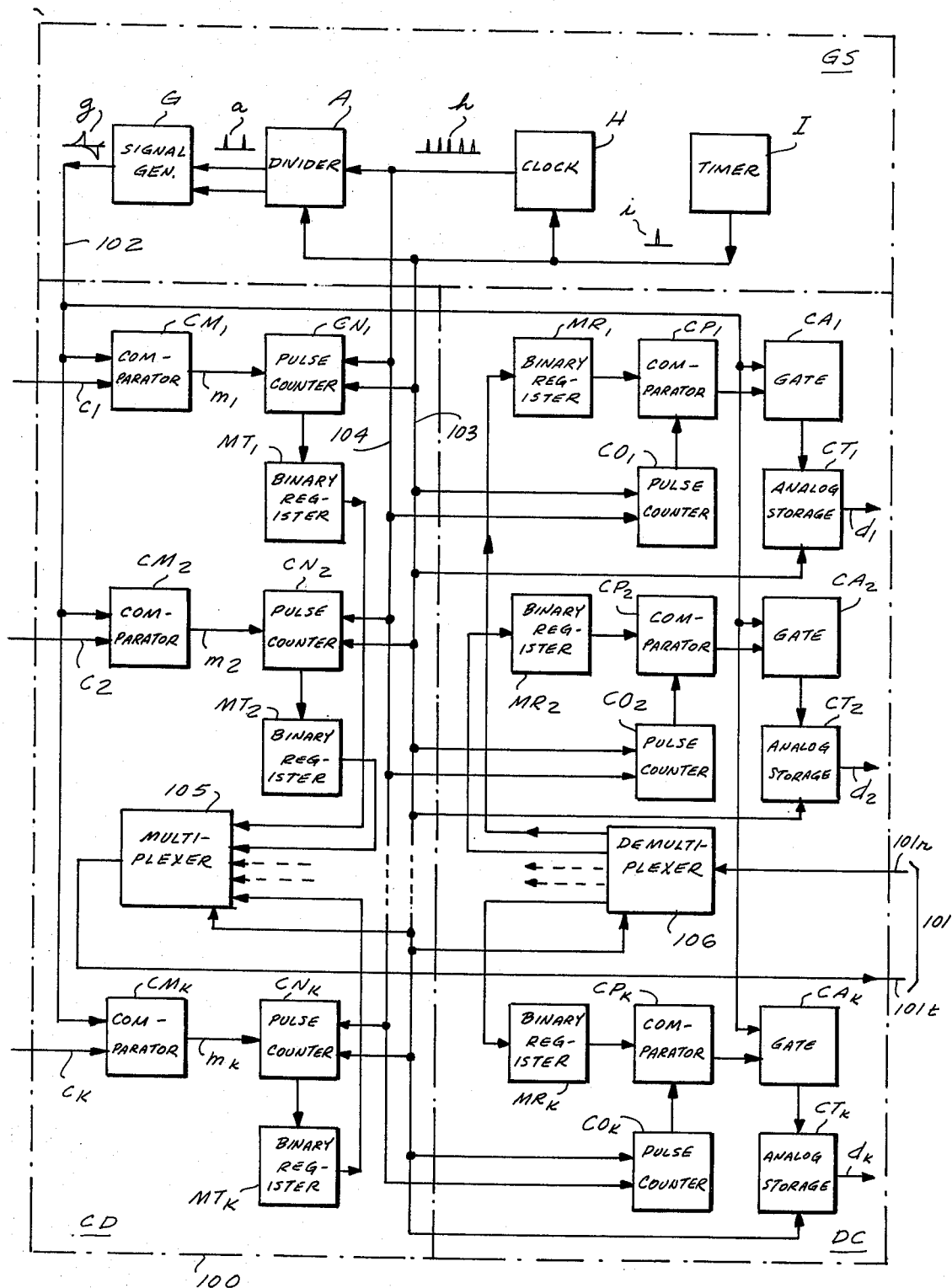
FIG. 1 is a block diagram of a transmitting terminal and a receiving terminal combined into a single station at the end of a communication link forming part of a TDM telecommunication system equipped with my improved compander.

The system shown in FIG. 1 comprises a station 100 connected via a transmission line 101 to a similar station not shown, line 101 having an incoming branch 101r and an outgoing branch 101t. Station 100 is divided into a coding unit CD, forming part of a transmitting terminal, and a decoding unit DC, forming part of a receiving terminal. A control unit GS, common to both units CD and DC, includes a timer I, a clock circuit H controlled by timing pulses $i$ from component I, a binary frequency divider A with a step-down ratio of 1:16 also controlled by the timing pulses $i$, and a signal generator G under the control of divider A as more fully described hereinafter with reference to FIG. 3. This divider receives a train of isochronous clock pulses $h$ from circuit H and derives from every 16th clock pulse a switching pulse $a$ delivered to signal generator G. The latter, in turn, produces a recurrent bipolar reference voltage $g$ described hereinafter with reference to FIGS. 2A and 2B.

Figure 4:
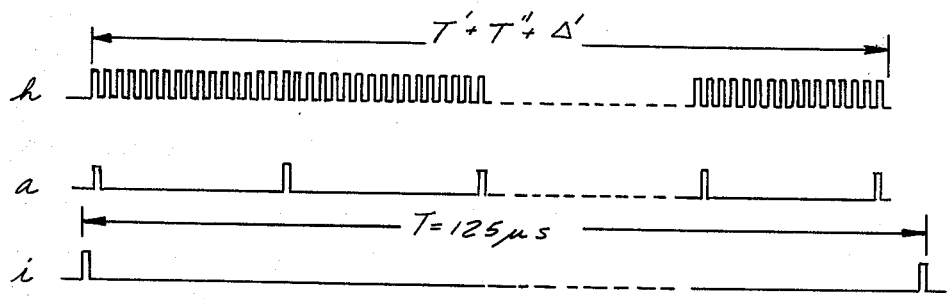
FIG. 4 is a timing diagram for the system of FIG. 1.

Coding unit CD is connected to a multiplicity of incoming local lines $c_1, c_2, \ldots c_k$ terminating at respective analog-type comparators $CM_1, CM_2, \ldots CM_k$ each having a second input connected to an output lead 102 of signal generator G carrying the refernece voltage $g$. Each comparator forms part of an individual coder also including a binary pulse counter $CN_1, CN_2, \ldots CN_k$ with input connections to a pair of conductors 103, 104 respectively carrying the timing pulses $i$ and the clock pulses $h$. Each timing pulse $i$ sets the counter to zero preparatorily to a counting of clock pulses $h$, a total of 256 such clock pulses occurring within two consecutive coding intervals T', T'' (see FIGS. 2A, 2B and 4) which together are somewhat shorter than a sampling period T initiated by a timing pulse $i$; the part of the sampling period not occupied by the two consecutive coding intervals T', T'' is utilized, in a conventional manner not further described or illustrated, for the transmission of synchronization signals to the remote station. Each pulse counter $CN_1$ etc. is stopped by the associated comparator $CM_1$ etc. whenever the latter detects an equality between the two analog signals applied thereto via incoming line $c_1$ etc. and signal lead 102. The code then stored in the several stages of the counter is read out into a binary register $MT_1, MT_2, \ldots MT_k$; the corresponding control leads from the comparators to the counters have been indicated at $m_1, m_2, \ldots m_k$.

A multiplexer 105 of conventional construction, controlled by the timer I via lead 103, receives the code words stored in registers $MT_1 - MT_k$ and assembles them in a message frame, together with the aforementioned synchronization signals, for transmission over outgoing branch 101t to the remote station whose construction is assumed to be the same as that of station 100. Code words arriving over incoming branch 101r are distributed by a demultiplexer 106, likewise controlled by the timer I via lead 103, to a multiplicity of binary registers $MR_1, MR_2, \ldots MR_k$ included in decoding unit DC, each of these registers forming part of a respective decoder individual to an outgoing line $d_1, d_2, \ldots d_k$. Registers $MR_1$ etc. feed respective digital comparators $CP_1, CP_2, \ldots CP_k$ also receiving the readings of associated binary counters $CO_1, CO_2, \ldots CO_k$ which are reset by timing pulses $i$ and stepped by clock pulses $h$ via leads 103 and 104. The output lead 102 of signal generator G is connected to respective analog-type storage circuits $CT_1, CT_2, \ldots CT_k$ by way of respective gates $CA_1, CA_2, \ldots CA_k$ which are normally closed but which are opened by the associated comparator $CP_1$ etc. at the instant when the binary code word in the corresponding register $MR_1$ etc. matches the reading of counter $CO_1$ etc. The instantaneous value of reference voltage $g$ is thus stored in the analog registers $CT_1 - CT_k$ which may be conventional holding circuits or integrators with a short time constant.

Figure 2A:
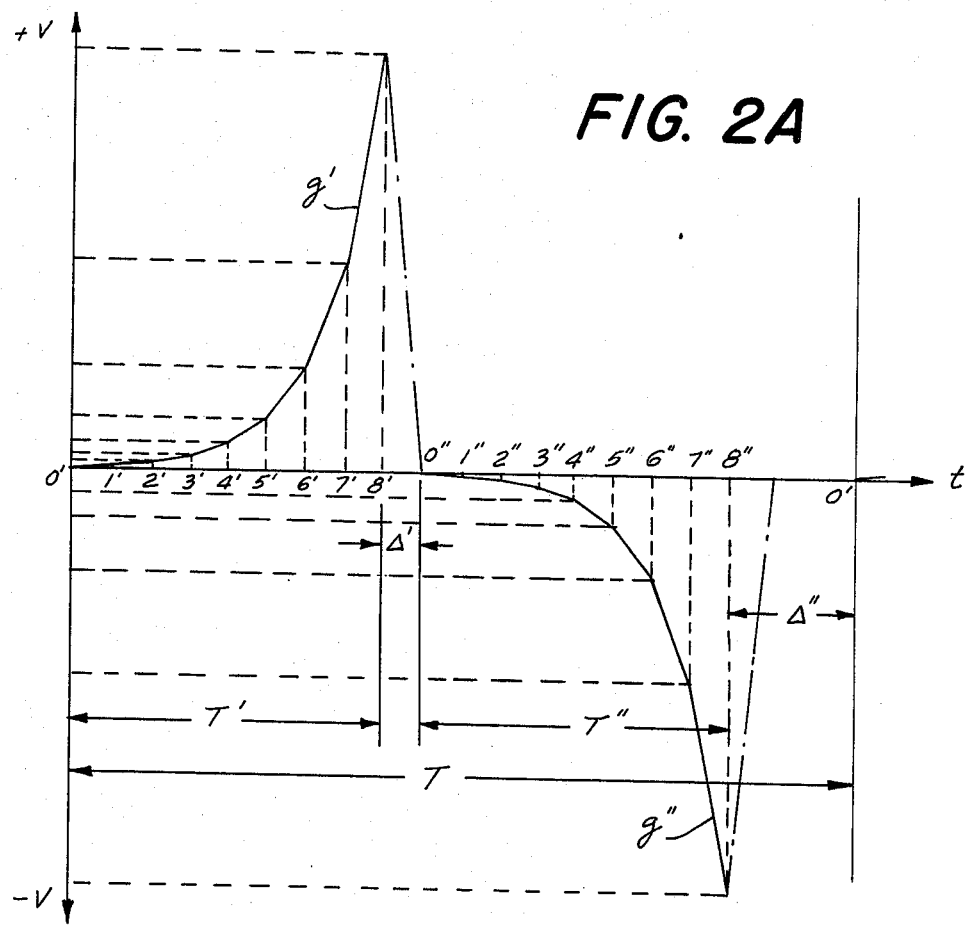
FIG. 2A is a graph of a reference voltage periodically generated in my improved compander.
Figure 2B:
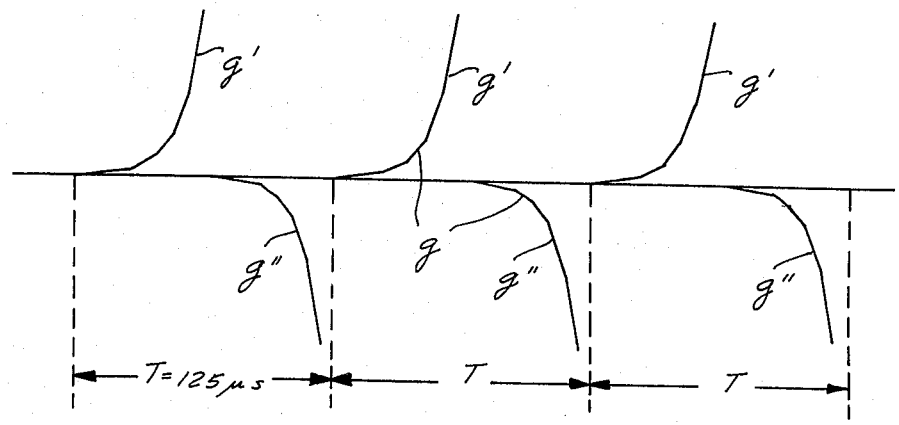
FIG. 2B shows several cycles of the reference voltage of FIG. 2A occurring in successive sampling periods.

As FIG. 2A shows, reference voltage $g$ is split into two branches $g'$ and $g''$ of positive and negative polarity generated, respectively, during coding intervals $T'$ and $T''$. Each of these branches is divided into $2^3=8$ straight segments of progressively increasing slope, except for the first two sections which are of identical slope in order that the curve may start at the origin $0'$ or $0''$. Beginning with the third segment, the slope doubles from one segment to the next. FIG. 2B shows the alternation of curves $g'$ and $g''$ during consecutive sampling periods T of 125μs. The upper and lower voltage limits of the amplitude range encompassed by the curves $g'$ and $g''$ have been given with +V and −V in FIG. 2A.

The rise of the positive branch $g'$ of the reference voltage $g$ starts in FIG. 2A at the origin $0'$ and continues for eight consecutive pulse cycles of frequency divider A (FIG. 1) ending at instants $1', 2', \ldots 8'$, all these pulse cycles being of the same duration. The negative branch $g''$ starts symmetrically at the origin $0''$ and continues over eight further pulse cycles ending at instants $1'', 2'', \ldots 8''$. A pause $\Delta'$ between points $8'$ and $0''$ is used to restore the pulse generator to zero. A similar pause $\Delta''$ intervenes between point $8''$ and the origin $0'$ of the next sampling period. Pause $\Delta''$, which may be substantially larger than pause $\Delta'$, may be used for the transmission and reception of the aforementioned synchronization signals. As more fully discussed hereinafter with reference to FIG. 3, clock circuit H is inhibited during these intervals $\Delta'$ and $\Delta''$ so that counters $CN_1-CN_k$ and $CO_1-CO_k$ are not stepped.

Figure 3:
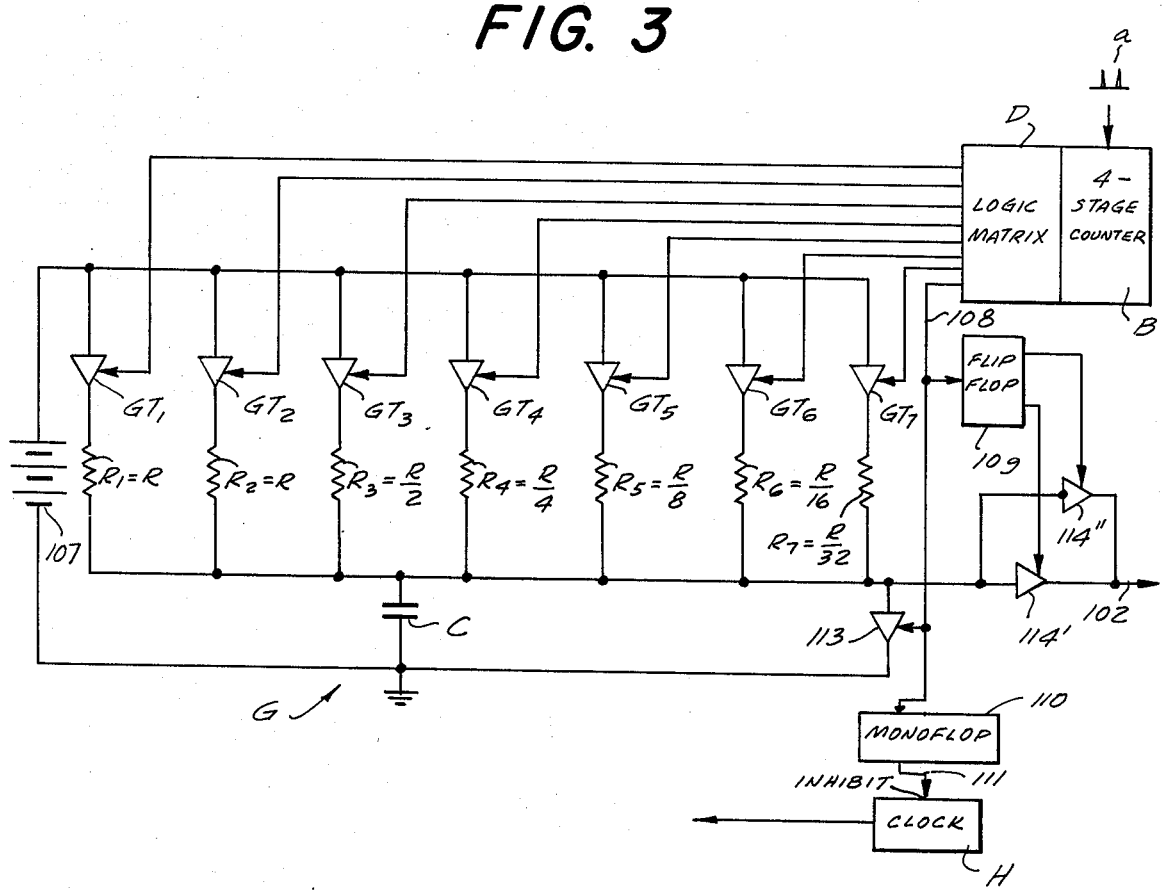
FIG. 3 is a more detailed circuit diagram of a signal generator producing the reference voltage of FIGS. 2A and 2B.

Reference will now be made to FIG. 3 which shows a preferred embodiment of the signal generator G of FIG. 1. This generator comprises a direct-current source 107, shown diagrammatically as a battery, with a terminal voltage substantially higher than the absolute value of voltage levels ±V in FIG. 2A. Battery 107 is connected across an impedance network comprising a capacitor C in series with a combination of seven parallel resistors $R_1-R_7$ of magnitudes, R, R, R/2, R/4, R/8, R/16 and R/32, respectively, each resistor lying in series with a normally open switch $GT_1-GT_7$ here shown schematically as an amplifier. Switches $GT_1-GT_7$ have control electrodes connected to respective output leads of a logic matrix D which receives the stage outputs of a four-stage binary counter B, the latter being stepped by the switching pulses $a$ from frequency divider A so as to reach its full count 16 times during a sampling period T.

Since clock circuit H is deactivated after the 256th pulse $h$, the pause $\Delta''$ may be of any convenient length as determined by the timer I. The relative values of voltage V, capacitance C and resistance R should be so chosen that the shortest time constant $R \cdot C/64$ substantially exceeds a coding or decoding interval $T', T''$, for near-linear charging.

The first switching pulse $a$ of a sampling period T, occurring at instant $0'$ immediately after the start of clock H by a timing pulse $i$, places the counter B in a position (e.g. 0000) in which only the switch $GT_1$ is closed so that capacitor C is charged solely through resistor $R_1$. This condition continues after the arrival of the second switching pulse at time $1'$ so that the capacitor potential rises with a substantially constant slope in the period $0'-2'$ (see FIG. 2A). The third switching pulse, arriving at the time $2'$, closes the switch $GT_2$ to place the resistor $R_2$ in parallel with resistor $R_1$, the combined resistance being now R/2. Thus, the slope of the charging curve doubles in the period $2'-3'$. Next, the fourth switching pulse at instant $3'$ brings about the closure of switch $GT_3$ and the connection of resistor $R_4$ in parallel with its predecessors, making the total network resistance equal to R/4; this is reflected by another doubling of the slope in the period $3'-4'$. The fifth switching pulse at time $4'$ initiates a further doubling of the slope in the period $4'-5'$ by closing the switch $GT_4$ to include the resistor $R_4$ in the parallel combination; thus, the network resistance is now R/8. At instant $5'$, the sixth switching pulse causes closure of switch $GT_5$ to bring in the resistor $R_5$, making the network resistance equal to R/16 and again doubling the slope in the period $5'-6'$. The seventh switching pulse has the effect of closing the switch $GT_6$ at time $6'$, with resulting closure of switch $GT_6$ and connection of resistor $R_6$ in series with capacitor C; with the network resistance now lowered to R/32, the charging rate and with it the slope of the curve doubles in the period $6'-7'$. Finally, the eight switching pulse at time $7'$ closes the switch $GT_7$, establishing a minimum network resistance of R/64 and doubling once again the slope of the charging curve in the period $7'-8'$.

In the assumed case, the counter B now has the reading 0111 so that the next switching pulse, at instant $8'$, changes its count to 1000. Logic matrix D responds to this new reading by energizing a lead 108 which has the effect of switching a flip-flop 109 and tripping a monoflop 110 of off-normal period $\Delta'$, which may be equal to one or more switching-pulse cycles $1'-2'$ etc. A pulse on an output lead 111 of this monoflop serves to inhibit the clock circuit H for the duration of this off-period. At the end of that period, monoflop 110 unblocks the clock H whereupon the next switching pulse $a$, at instant $0''$, resets the counter B to its initial position (0000), thereby starting a new coding interval analogous to the preceding interval $T'$. Energization of lead 108 during the off-period of monoflop 110 closes another electronic switch 113 connected across capacitor C to discharge that capacitor. The switches $GT_1-GT_7$ are open in this counter position.

The potential of capacitor C is transmitted to the lead 102 by way of two amplifiers in parallel, i.e. a noninverting amplifier 114' and an inverting amplifier 114'' of like gain. Flip-flop 109, when set in the pause $\Delta''$, unblocks the amplifier 114' so that the capacitor voltage reaches the lead 102 with its original positive polarity during the coding interval $T'$. On being reset in the next pause $\Delta'$, flip-flop 109 unblocks the inverting amplifier 114'' so that the polarity of the capacitor voltage is reversed during the following coding interval $T''$. This operation results in the alternately positive and negative voltage branches $g'$ and $g''$ of FIGS. 2A and 2B.

In FIG. 5 an incoming line, generically designated $c_j$, is shown connected to the associated comparator $CM_j$ whose output $m_j$ stops the corresponding counter $CN_j$ as soon as the reference voltage on lead 102 equals the amplitude sample on line $c_j$. Counter $CN_j$ is shown to have eight stages, thus one stage more than necessary for producing the 7-bit code word representing the compressed signal amplitude to be communicated to the remote station. At the beginning of a sampling period, this counter is reset by a pulse $i$ on lead 103 so as to have an all-zero reading. Since in the first half of this scanning period the reference voltage $g$ is assumed to have positive values, only a positive signal amplitude on line $c_j$ will give rise to an output signal on comparator lead $m_j$ to halt the count. Under these circumstances, the eighth stage of the counter carries the sign bit 0 which is transferred together with the 7-bit amplitude code to the 8-stage register $MT_j$ at the beginning of the next sampling period under the control of timing pulse $i$, preparatorily to being extracted from that register by the multiplexer 105 (FIG. 1) in the proper time position within a message frame.

If, however, the incoming signal happens to be of negative polarity, comparator $CM_j$ does not respond during the first 128 clock pulses $h$. The last of these pulses loads the eighth stage of the counter with a bit 1 so that the count now stands at 10000000. As the reference voltage $g$ goes negative, a match will be detected between that reference voltage and the signal voltage at some point during the ensuing coding interval $T''$. Comparator $CM_j$ thus stops the counter $CN_j$ in a position in which its eighth stage invariably contains a finite sign bit 1.

At the receiving end, the 8-bit code word thus produced arrives at the 8-stage register $MR_j$ at the beginning of a sampling period, under the control of demultiplexer 106 (FIG. 1) responding to the timing pulse $i$ on lead 103. The sign bit in the eighth stage of this register determines whether the comparator $CP_j$, also receiving the output of the 8-stage counter $CO_j$, is to open the sampling gate $CA_j$ during the first decoding interval $T'$ or the second decoding interval $T''$. Thus, the gate $CA_j$ passes either a positive or a negative voltage from lead 102 to a storage circuit $CT_j$ for transmission to the outgoing line $d_j$.

In FIG. 6 I have illustrated a modification of the coder and decoder of FIG. 5 wherein the comparator $CM_j$ receives the amplitude sample from line $c_j$ via a noninverting amplifier 115' or an inverting amplifier 115'' connected in parallel, the signal emanating from either amplifier being of the same (e.g. positive) polarity. Amplifier 115'', conducting only in the presence of negative input voltages, works through a limiter 116 into an AND gate 117 also receiving the output on lead $m_j$ from comparator $CM_j$. AND gate 117, conducting only in the presence of negative signal amplitudes, loads a finite sign bit 1 into the eighth stage of register $MT_j$. A diode 118 isolates the limiter 116 from output amplifier 115'.

Counter $CN_j$, which does not register a sign bit in this instance, has only seven stages. The operation is otherwise analogous to that of the coder shown in FIG. 5.

At the corresponding decoder, the unipolar reference voltage on lead 102 passes in parallel through a pair of amplifiers similar to those shown at 115' and 115'', i.e. a noninverting amplifier 117' and an inverting amplifier 117''. The sign bit in the eighth stage of register M is passed directly to a control electrode of amplifier 117'' and through an inverter 118 to a corresponding electrode of amplifier 117'; thus, a sign bit of value 0 allows the reference voltage on lead 102 to pass with its original (positive) polarity through gate $CA_j$ to storage circuit $CT_j$ whereas a sign bit of value 1 causes a polarity inversion and makes the output signal on line $d$ negative. Counter $CO_j$ in this instance also has only seven stages.

I claim:

1. A compander for a TDM telecommunication system wherein a transmitting terminal, having means for periodically sampling the signal amplitudes on a multiplicity of incoming signal channels, is connected via a communication link with a receiving terminal having means for distributing arriving amplitude samples to a multiplicity of outgoing channels, comprising:

synchronized timing means at said terminals for generating respective sequences of $2^n$ isochronous clock pulses during a coding interval occurring at least once per sampling period, with $n = m + p$, the number $2^n$ representing a multiplicity of quantizing amplitude levels subdivided into $2^m$ groups of $2^p$ amplitude levels per group;

a first signal generator at said transmitting terminal and a second signal generator at said receiving terminal controlled by said timing means for respectively producing, during each coding interval, a first and a second reference voltage each following a quasi-exponential curve divided into $2^m$ straight segments each coinciding with a series of $2^p$ clock pulses;

a plurality of coders at said transmitting terminal, one for each incoming channel, each including a first comparator connected to said first signal generator for receiving said first reference voltage and further connected to the respective incoming channel for receiving amplitude samples to be coded, each of said coders also including a first binary counter for said clock pulses connected to said timing means for zero-setting at the beginning of each coding interval and further connected to said first comparator for halting its count whenever the instantaneous magnitude of said reference voltage equals the amplitude sample to be coded;

multiplexing means at said transmitting terminal for delivering respective binary codes, representing the counts of the several first counters thereof, in interleaved relationship to said communication link during each sampling period;

a plurality of decoders at said receiving terminal, one for each outgoing channel, each including a second binary counter for said clock pulses connected to said timing means for zero-setting at the beginning of a decoding interval of the same duration as said coding interval; and demultiplexing means at said receiving terminal for distributing arriving binary codes from said communication link to said decoders during each sampling period, each decoder also including a second comparator connected to said demultiplexing means and further connected to said second counter, output means including a normally closed sampling gate inserted between the respective outgoing channel and said second signal generator, said sampling gate being controlled by said second comparator for opening at the instant when an arriving binary code matches the count of said second counter to pass the instanteneous amplitude of said second reference voltage.

2. A compander as defined in claim 1, further comprising a first binary register in each coder inserted between said multiplexing means and said first counter, and a second binary register in each decoder inserted between said demultiplexing means and said second comparator.

3. A compander as defined in claim 2 wherein said output means includes storage means for the instantaneous amplitude of said second reference voltage passed by said sampling gate.

4. A compander as defined in claim 1 for the coding and decoding of bipolar signal amplitudes, further comprising polarity-discriminating means in each coder for supplementing said binary codes with a sign bit, and polarity-restoring means in each decoder responsive to the sign bit in each arriving binary code.

5. A compander as defined in claim 4, wherein said coding interval occurs twice in each sampling period, said first and second signal generators being each provided with inverting means responsive to said timing means for reversing the polarity of said first and second reference voltages during alternate coding intervals, said polarity-discriminating means comprising an $(n+1)^{th}$ stage in said first counter, said polarity-restoring means comprising an $(n+1)^{th}$ stage in said second counter.

6. A compander as defined in claim 1 wherein said timing means includes frequency-dividing means for deriving a switching pulse from every $(2^p)^{th}$ clock pulse in each coding interval, each of said signal generators comprising pulse-counting means with at least m binary stages connected to said frequency-dividing means for stepping by successive switching pulses, a source of direct current, a resistive/capacitive network connected across said source, said network including switch means for altering the resistivity restivity thereof, and logical circuitry connected to said $m+1$ stages for operating said switch means in response to said switching pulses.

7. A compander as defined in claim 6 wherein said network comprises $2^m-1$ resistors connected in parallel across said source by way of a common capacitor, the first two of said resistors being of identical resistance R, the remaining resistors having respective resistances R/2, R/4 and so forth progressively diminishing by a factor of 2, said switch means open-circuiting all but the first resistor until the occurrence of the third switching pulse and thereafter successively connecting additional resistors in circuit with said capacitor.

8. A compander as defined in claim 7 wherein $m = 3$, $p = 4$ and the number of said resistors is seven.

* * * * *